(12) United States Patent
Jaynes et al.

(10) Patent No.: US 6,407,613 B1
(45) Date of Patent: Jun. 18, 2002

(54) MULTIPURPOSE TEST CHIP INPUT/OUTPUT CIRCUIT

(75) Inventors: Dwight Jaynes, Richardson; Michael D. Bienek, Wylie, both of TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 08/863,832

(22) Filed: May 27, 1997

(51) Int. Cl.[7] .............................................. H03K 17/62
(52) U.S. Cl. ........................ 327/415; 327/166; 327/199; 714/731
(58) Field of Search ................................. 327/164–166, 327/199, 202, 291, 295, 415, 73.1; 714/724, 731, 733, 734, 744

(56) References Cited

U.S. PATENT DOCUMENTS

| | | | |
|---|---|---|---|
| 4,441,075 A | | 4/1984 | McMahon ................... 714/731 |
| 5,214,682 A | * | 5/1993 | Clark ........................... 377/56 |
| 5,608,736 A | * | 3/1997 | Bradford et al. ............ 714/727 |
| 5,729,678 A | * | 3/1998 | Hunt et al. .................... 714/43 |
| 5,923,621 A | * | 7/1999 | Kanekal et al. ............. 368/117 |

FOREIGN PATENT DOCUMENTS

EP     0398605     11/1990

* cited by examiner

*Primary Examiner*—Timothy P. Callahan
*Assistant Examiner*—Minh Nguyen

(57) ABSTRACT

The circuit to be used either to create a simultaneously switching outputs (SSO) event or to create a simultaneously switching inputs (SSI) event. The circuit uses a toggle register to generate a toggling signal and a signal line to operate logic to select the toggling signal as output from the circuit for the SSO event. The signal line is connected to an external pin. The circuit uses another signal line, also connected to an external pin, to disable or tristate the output driver that drives the I/O pin. This permits the circuit to receive input for the SSI event. Two chips, each having a plurality of such circuits, can be arranged so that one chip generates the SSO event and sends it to the second chip, which is configured to receive the SSI event. The circuit also has a pair of registers in a cascade arrangement to provide precise control of the output signal. The circuit has an additional register to disable the output driver and permit the circuit to receive input for a scan event.

20 Claims, 2 Drawing Sheets

MULTIPURPOSE TEST CHIP INPUT/ OUTPUT CIRCUIT

TECHNICAL FIELD OF THE INVENTION

This application relates in general to system level testing of interconnects for signal integrity, and in specific to the testing of particular parameters under substantially authentic conditions, thus allowing the determination of the effects on the signal and noise margins from specific design factors.

BACKGROUND OF THE INVENTION

In the past, the determination of how parameters were affecting signal integrity and noise margins for systems was typically accomplished by an estimation technique involving reduction and extrapolation. First, the chip, or a problem area of the chip, is reduced down to a very simple case, typically reducing the chip to only a handful of pins under very controlled circumstances. The reduction allows simulation of the chip circuitry. Next, the results of the simulation are then extrapolated from the narrow reduction focus of a few pins, to a more general case which has a higher pin count, e.g. the whole chip or the problem area.

This approach works well for a number of years. However, over time, the industry has evolved, so that the number of pins on a chip has substantially increased as the complexity of the chips has increased. Moreover, the amount of current and number of outputs that are being switched have grown exponentially over time. This has resulted in the inability of the estimation technique to produce a simulation that can be extrapolated into a model that is close enough to the real chip system to provide a meaningful result for the signal and noise margin measurements.

The estimation approach uses the symmetry and the geometry of the actual high pin count device as a pattern for the reduction and subsequent extrapolation. Thus, the high pin count device is be reduced down to a single quadrant of pins, and then the area is narrowed even further down to the smallest symmetrical portion that can be found. This makes the problem simple enough to allow for simulation. The simulation would be run on only that small subset portion, and then the result would be extrapolated to yield a result for the entire chip or a larger area of the chip.

This approach has two problems. First, the approach simplifies the problem to the extent that accurate results are not possible, and second, the approach isolates or limits the evaluation to only a single problem. For instance, with the problem of cross-talk, by reducing a chip down to a very small portion and examining only cross-talk, other related effects that can contribute to cross-talk or co-act with cross-talk to form a combined worse case, such as ground bounce or ground plane collapsing, are ignored and not reflected in the computed results.

Therefore, the combined effects of these problems would be missed when extrapolating up from the simple model, and this introduces a great deal of error because realistic representations are not being produced of the timing relationships for the events. Thus, an accurate reflection of the combined total event and its impact on the system performance is not obtained.

Most often, overly pessimistic results are obtained. A system designed from these results would under utilize the technology capabilities, and would have larger margins than necessary. The system may under perform as compared to other systems. To compensate for this, based from experience, the designers knowing that the system can actually be pushed harder than is indicated by the analysis, will attempt to do so by guessing or estimating what a realistic result would be. This approach often runs the risk of design failure, because a design is adopted that is more aggressive than is supported by simulation of data.

Also, overly optimistic results may be obtained from the test procedure discussed above. A system designed from these results would over utilize the technology capabilities, and would have little or no margins, and possibly even negative margins. The system may become unstable and fail frequently. Again, the designers, knowing this from experience, will take a more conservative approach which leads to using larger design margins to cover for the inaccuracies. This scenario results in an end-product which is not as competitive as it should be in the market because of overcompensation due to the inaccuracies.

Therefore, the estimation approach does not produce accurate results, and forces designers to make approximations as to the true values of the system. The estimation approach will not flag a problem where a problem is known to exist. So this approach has begun to breakdown because of the rising complexity of the chips and their pin counts.

SUMMARY OF THE INVENTION

These and other objects, features and technical advantages are achieved by a system and method which uses a test chip that has plurality of individually programmable input/ output (I/O) circuits.

The invention that is described herein allows a circuit on the test chip to be programmed individually for I/O function and, by virtue of replication of this circuit many times across the test chip, event patterns can be created for simultaneously switching outputs (SSO) or receiving patterns can be created for simultaneously switching inputs (SSI) that represent real usage of a very high pin Application Specific Integrated Circuit (ASIC) device.

The invention allows flexibility to tailor the testing strategy at test time in the lab, in real time, and to create situations for testing to investigate any pin on the device transitioning in the presence of patterns of other I/O locations that are changeable on the fly. This allows the tester to perform a much richer test and a much more complete investigation into the combinational effects of these type of events and how they impact the design margins for signal and noise margins, e.g. for cross-talk, ground bounce, and signal integrity concerns. This approach achieves a clearer picture of the actual design margins are by category, incorporating the interaction of these various effects, and producing a set of summary restrictions for the real design process. This process allows the designer to achieve a set of design rules to be used on the final design which represents the best combination of necessary risks versus margins in the design to enable a balanced design to be realized with greater performance.

The chips of today use a design that has a multilevel interconnect, where there is an IC chip on a package which provides a second level interconnect, which is then socket or solder ball mounted onto a board which provides the first or main interconnect layer. The invention allows for the investigation of interactions at each layer of interconnect. For example, the cross-talk at the chip interconnect layer level or the second level interconnect level can be investigated by separating out the different effects through the choices of the I/O locations made to be the victim (cross-talk receiver) and made to be the talker (cross-talk sender). Additionally, cases can be chosen or combined to determine where the worst cases for cross-talk are located due to physical proximity on each of the layers. This enables the designer to receive an overall view of cross-talk under worst case conditions and to break that number down by repeated measurements under different conditions. The designer can determine the component contributions from each level of interconnect.

This provides the designer with a better understanding of all the contributory factors of where problems might exist, and then discloses a clear suggestion of which solution may be the best in terms of improving the performance of the package interconnect to avoid problems in the future to achieve a proper margin as might be required by an individual design.

This is a very uncomplicated approach. There are two reasons why it is important for the approach to be uncomplicated. The first is time, in that, a test chip is completed in the time between when a design program is embarked on and when the physical designs for the actual final system are committed to market. Therefore, any testing on a test chip must be performed within that time frame. Thus, the approach must be uncomplicated and easily implementable to produce results with a minimum overhead and delay. This is because the information that is being produced is fed back into the design process for the final system, which is time critical. Thus, more complex and ornate testing solutions do not provide the quick turn around that is required to be able to rapidly implement the test chip and then obtain useable data from it. Therefore, one of the goals for this invention is to keep it straightforward, so that the control logic, the board design, and the data and measurement processes could all be executed in the time necessary to achieve the feedback to the final system design and thus, the system could then be on target for its time to market cycle.

The second reason is that the testing involves timed events. One of the tests attempts to create a simultaneous event, and in order to do that, the testing circuits need to be highly replicated without variability. This inventive approach achieves such a result in that it provides a very uniform launch of simultaneous switching output and a very uniform capture of simultaneous switching input which supplies the overall current surge profile that is necessary to determine an accurate worst case in the design.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1:
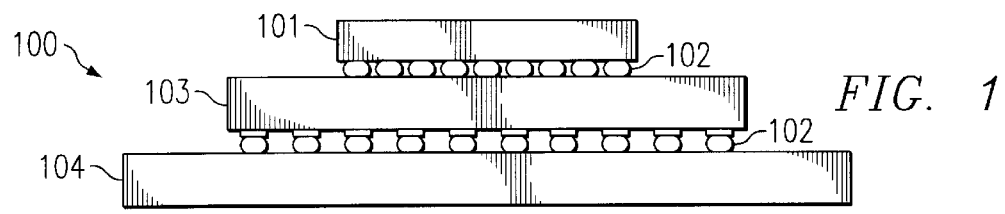
FIG. 1 depicts a layered board system with a sandwich arrangement comprising a device layer, a second level interconnect layer, and a main board layer.

FIG. 1 depicts a layered board system 100 having a sandwich arrangement comprising surface mounted device (SMD) layer 101, second level interconnect layer 103, and main board layer 104. Each of these layers are secured together and electrically connected by a layer of ball grid array (BGA) balls 102. There are multiple SMDs 101 and interconnect layers 103 mounted on main board 104. This arrangement is shown for illustrative purposes, and instead of using BGAs 102, the layers could use sockets (not shown), or other attachment methods. Moreover, SMD 101 could be another type of device, for example, a device that is wire bonded in the package.

SMD 101 usually is a high performance application specific integrated circuit (ASIC) chip which has a high pin count. The die in SMD 101 is flip chip mounted to second level interconnect 103, which means that the transistor features of the die are flipped upside down, and then the pads of the die are attached to second level interconnect 103 via BGA 102. The BGA process is usually the standard process known as C4, which was developed by IBM.

The die in SMD layer 101 is itself a multi-layer interconnected circuit, typically with 4 layers of metal interconnect. Second level interconnect 103 is also a multi-layer interconnect with between 8 and 12 layers. The main board could have more than 20 layers.

In each of these interconnects, die 101, second level 103, and board 104, have multiple layers o f signals which are passing closely together, along with power and ground planes that are distributing power through the layers. The proximity of the different layers and paths may result in erroneous operation of the devices, particularly where a large portion of devices transition at the same time.

For instance, during a simultaneous switch output (SSO) event, a large number of output drivers, perhaps as many as 350, are going to attempt to drive at the same time, perhaps all trying to drive high. This SSO event will generate a large amount of noise due to the capacitance and inductance from all of those signal traces making a transition from low to high. This will cause ground bounce and cross-talk throughout the system, meaning paths that should not have a signal thereon will have one induced thereupon.

Simultaneously, the SSO event causes a large drain of power, as the devices will have to be supplied the power required for the current that is going to be driven off the chip. The power is supplied from the power planes in board 104, going through second level interconnect 103 planes, to die 101. The voltage supplied t h rough these planes will collapse in response to the SSO current drain because of their own resistance, inductance, and capacitance (RLC) characteristics. Thus, they will also react to the SSO event.

The connection points fan out from each level to the next level. Meaning that die 101 is not as large in size as second level interconnect 103 that it attaches to, so that there is a fan out from the connection points or bumps on the die attachment side to the main broad attachment side. Similarly, there is fan out between second level interconnect 103 and board 104. Thus, a die 101 that is typically a half inch in size is connected to second level interconnect 103, which may be 2 inches on a side, which is attached to board 104, which may be 18 inches on a side.

Thus, FIG. 1 depicts a 3 level interconnect system that is supplying both signal and power into die 101 from board 104, and back from the die into the board with a very complex combination of RLC characteristics that will affect the overall performance of the circuit and the integrity of signals, both those on die 101 and those that are shipped off into board 104 to be received by another die.

Figure 2:
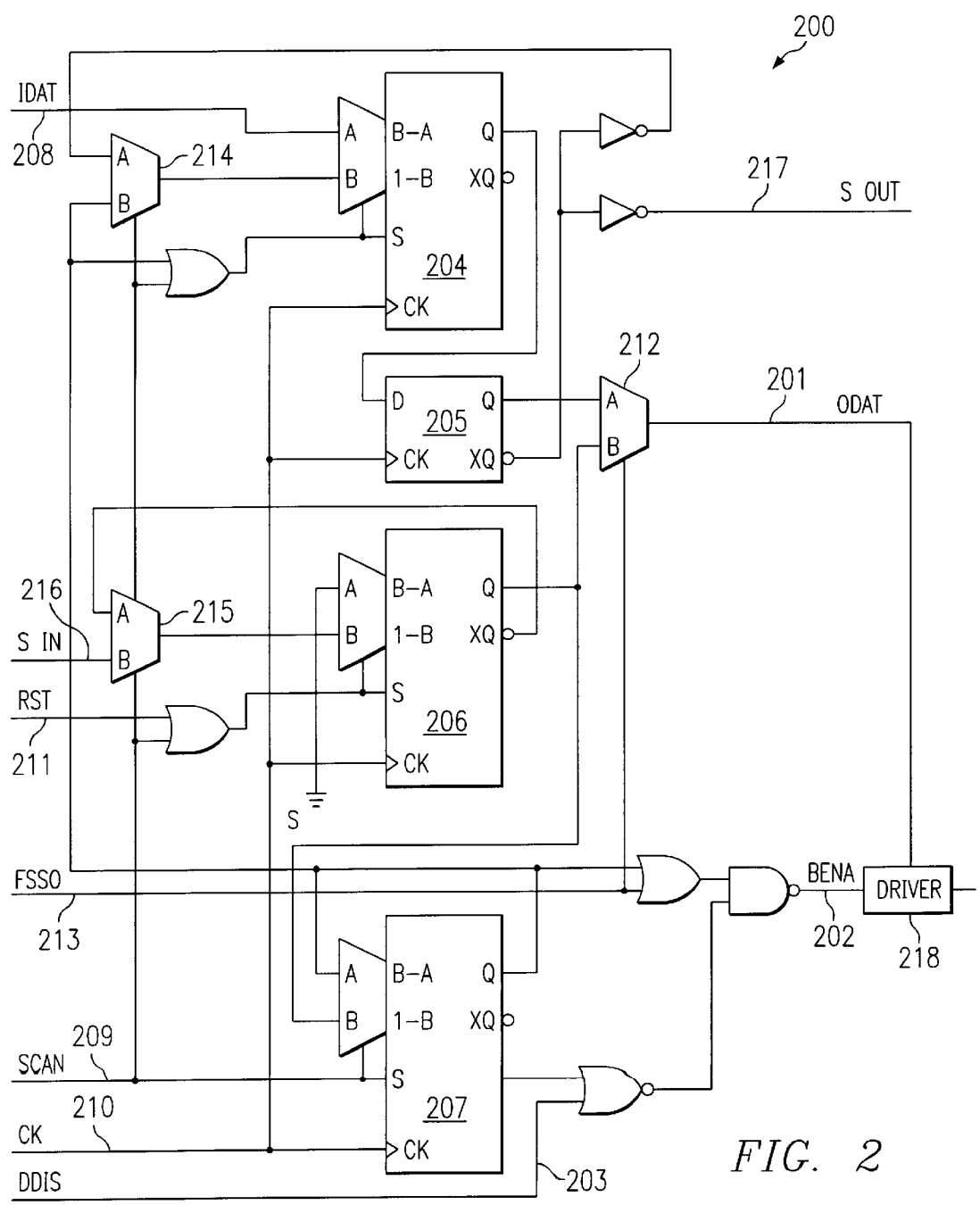
FIG. 2 depicts the testing circuitry that is reproduced on the test chip.

FIG. 2 depicts testing circuitry 200 that is reproduced on the test chip. The test chip would be mounted as shown in FIG. 1. The circuity is comprised of four registers, 204, 205, 206, and 207, that implement the testing functionalities. These registers control an individual chip I/O cell location, specifically a chip pin, through the I/O buffer and driver (not shown) of the chip. Each I/O cell is capable of performing as an input or as an output. As an output it can be tri-stated, where it is not enabled and the driver goes tri-state or high impedance, or it can be driving and circuit 200 sends out signals over the I/O pin.

The I/O cell, when driving an output off from chip 101 into second level interconnection 103, uses ODAT signal line 201, and this signal is controlling whether the output driver 218 is driving high or low. Similarly, the I/O cell output driver 218 can be enabled or tri-stated, and the signal that controls this state is BENA signal 202. If the I/O cell is not going to output, but is rather going to receive an input signal coming from second level interconnect 103 into chip 101, then the output enable is deselected via. tri-state with BENA signal 202 and the input coming into the chip would be captured into register 204 through signal path IDAT 208. The data value captured by register 204 could be scanned out, but in a purely testing situation, the value of data is less important than the noise of the event.

These test circuits 200 are replicated many times on chip 101 and the resulting chip is used in multiple instantiations on board 104. Two of these chips can be placed side by side, with one of them set to be the driver, and its outputs are enabled and driving a pattern to the second or receiving chip. The receiving chip is a duplicate of the driving chip, but has its I/O locations set to receive input only. Essentially the driving chip is set to SSO, and the receiving chip is set to SSI.

The DDIS signal line 203 provides the designer/tester direct control of the settings of these two chips. Hardwired DDIS control 203 leads directly from a device pin into the logic that sets the output drivers of the cells to either enable or tristate. Asserting this signal 203 allows a given location to be set to receive input. Thus, by setting a single pin control signal on the chip, a designer/tester can set that chip to have all or some of its I/O locations set up to receive input, and allow a simultaneously switching inputs (SSI) event to occur.

The chip would have additional control logic (not shown) that would allow the designer/tester to set particular ones of the circuits to receive input via tristating the output drivers using DDIS signal path 203.

Register 207 can also be used to tristate an individual cell's output driver. The value loaded into a cell's register 207 through the scanpath will determine whether that cell's output driver is enabled or tristated in cases whether that cell's DDIS signal path 203 and scan signal path 209 are not asserted.

Scan signal path 209 will also tristate the cell's output driver when asserted to keep output drivers quiet during scan operations. Therefore, there are three ways of setting up tristate. One is the hardwired control DDIS signal 203, which is connected to an external pin on device 101. The other the Q output from register 207 is passed through control logic to also activate BENA 202 signal, and the third via SCAN signal 209. The scanning operation will be discussed in more detail later in this disclosure.

Register 206 is a toggle register that provides a way to toggle I/O in very tight synchronization such that, time wise, there is a simultaneous switching of the outputs. Register 206 is set up so that its Q bar or XQ output feeds back to its input, so that it will toggle every time it receives a clock signal CK 210. Note, that since reset signal RST 211 is active-low, the MUX of register 206 will always be set to the B side, unless SCAN 209 is low and RST 211 is active.

Thus, all instantiations of circuit 100 can be set to start off in the in same phase by asserting RST 211, and after that register 206 (as well as, all other instantiations of register 206) will just toggle on and off in sequence. Different phase relationships can be set up between different instantiations of circuit 100 by controlling how the resets are asserted on individual circuits.

Figure 3:
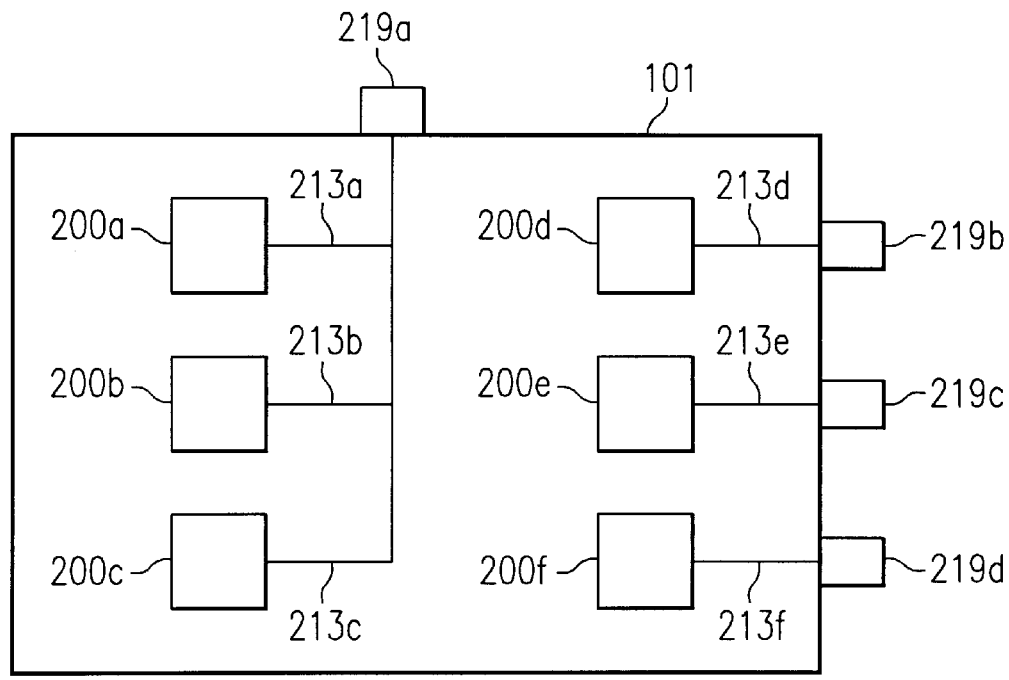
FIG. 3 depicts a plurality of the circuitry of FIG. 2 with signal lines connected to a signal pin.
Figure 4:
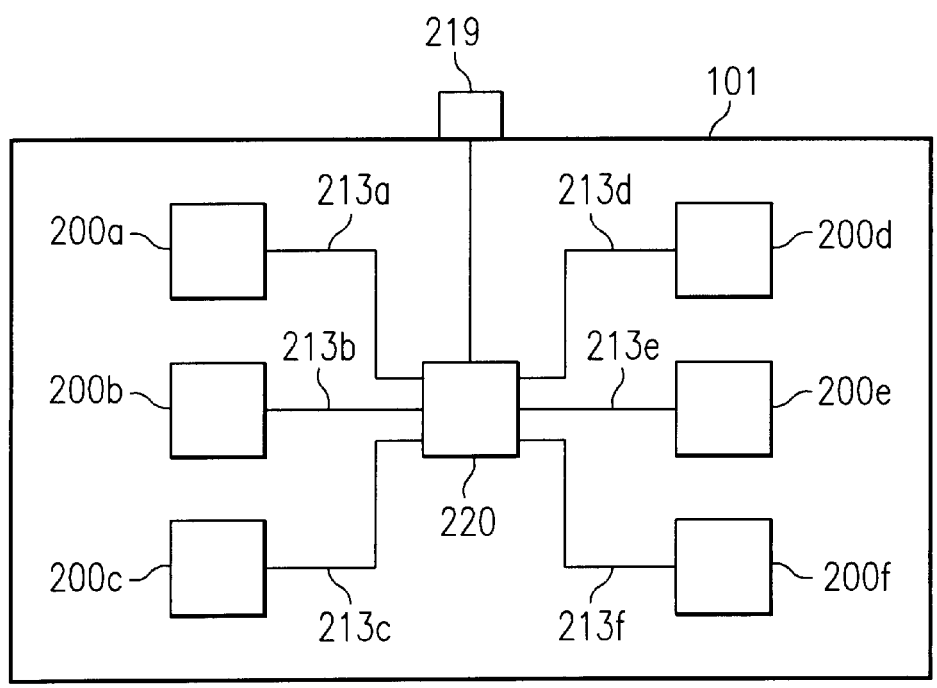
FIG. 4 depicts a plurality of the circuitry of FIG. 2 with signal lines connected to control logic.

The output of toggling register 206 feeds into two places. First, the output feeds into register 207 as scan input. Second, the output feeds into the B side of MUX 212, which is driving to ODAT signal 201, which driving off the chip. The sides of MUX 212 are selected by the force SSO signal FSSO 213. FSSO signal 213 will force an SSO event by enabling output ODAT 201 and selecting the SSO event signal to come from toggling register 206. FSSO signal 213 also activates the output driver via gate logic which forms BENA signal 202. The combination of FSSO signal 213 and toggling register 206 provides a very straightforward external switch to set a large number instantiations of circuit 100 to SSO and have them switch simultaneously to generate noise. As shown in FIG. 3, a portion of the FSSO signal lines 213a–213f, namely lines 213a–213c, are connected to a common signal pin 219a, while other signal lines, namely lines 213d–213f, are connected to respective pins 219b–219d. The chip would have additional control logic 220 of FIG. 4 that would allow the designer/tester to set particular ones of the circuits to SSO. Thus, a tester/designer can set all or a portion of circuits 100 on a chip to SSO.

Another way of performing this operation is to use register pair 204, 205. This process provides individual bit control on these outputs that is contained within register pair 204, 205. The Q output of register 204 feeds directly into D input of register 205 in a serial manner, such that particular values can be set up within these two registers, providing precise I/O control for circuit testing. This arrangement could have other uses, such as a signal generation source.

The Q bar or XQ output from register 205 is re-inverted (this approach is used to keep the fan out load on the Q output of register 205 low) and returns to the input of register 204, via the A side of MUX 214 and into the B side of the MUX of register 204, for selection of scan versus non-scan activity and then feeds back into 204.

Therefore, this two register pair 204, 205 is a scan set-able register pair. The two registers can be loaded with logical 'ones' in scan mode and it will cause the output to hold a steady 'one'. The two registers can be loaded with logical 'zeros' and it will stay low. The two registers can also be loaded with a logical 'one' in register 204 and a logical 'zero' in register 205 which will cause an output of a rising-edge out of this two register combination. The two registers can also be loaded with a logical 'zero' in register 204 and a logical 'one' in register 205 which will cause an output of a falling edge out of this two register combination. Thus, this pair provides direct control of a rising, falling, steady high, or steady low outputs that can be scannably programmed. These two registers enables a designer/tester to be able to hold any output that is in a design to a known state.

The programmability provided by the two register pair can be performed on each individual I/O where circuit 100 is replicated. For testing purposes, this circuit is typically replicated 350 or more times so that it can enable, though scan, each individual I/O to behave differently. They can all be rising and one of them falling, or all of them rising and one of them held steady high or steady low, or any other combination thereof with any number thereof in any of the four output states.

This permits much of the very deterministic testing to be readily performed, and provides excellent isolation capability for evaluation of realistic noise environment cases. Measurements can be made directly on particular characteristics, such as determining how much high margin there is on a steady state high output when all of the other outputs are going low and what is the effect of this characteristic on the noise margin. Another example could be to measure noise when an output is trying to drive low while all of its adjacent outputs are trying to drive high.

Register 204 also receives input signal IDAT 208. When circuit 100 is set-up to receive an input coming onto the chip through the I/O buffer, the output driver will be disabled, and the signal will come in through the I/O data input line IDAT 208 and be latched into register 204 with the next clock signal CK 210. If the data needs to be read out, then it is readable in scan mode by scanning out register 204 through the normal scan path. Thus, the designer/tester can read which level was actually received on the input.

When loading in scan mode, the scan signal SCAN 209 switches the MUXs to the B side. The MUX convention is that the control signal, when active-high, switches to the lower input, which is the B side. Thus, MUX 215 will switch to the scan in signal S_IN 216 as the input for register 206. S_IN 216 is typically coming from another circuit block, wherein several circuits are chained together by S_OUT 217 connecting to S_IN 216. Thus, S_IN 216 will come in and feed into register 206 through the B side of the MUX 215, and the B side of the MUX of register 206. The Q output of register 206 branches off to feed the B side of the MUX of register 207. The Q output of register 207 feeds into the B side of MUX 214 where it is passed through in scan mode to the B side of the MUX of register 204. Then, the Q output of register 204 is fed back into the D input of register 205. The Q bar or XQ output of register 205 is re-inverted, preventing an inversion in the scan chain, and goes out on the scan out line S_OUT 217 to the next circuit 100 in the scan chain as S_IN 216.

This completes the four registers in sequence on the scan chain. The scan chain is formed by having replicated circuits 100 connected together, by hooking the scan out signal S_OUT 217 of a preceding circuit to the scan in signal S_IN 216 of a subsequent circuit 100, to link all of the circuits in one continuous scan chain. This enables scan in set-up of data to control the output enable for a SSO event, wherein the starting values for registers 204, 205, are scanned in for output transition control. If in the input mode for a SSI event, this scan chain would permit scan in to register 207 of a state which would put the output driver in tri-state so that the output is disabled. Scan would also be used to scan a value into register 204, typically the opposite of the value that is expected to be captured on the input, for example if there is an expectation to capture a rising edge as an input coming in on IDAT, a zero is placed into the register so that it has the opposite state of what is trying to be captured. After capture, that value can be scanned out during scan mode as chip output coming off the output driver of the chip I/O cell.

It should be noted that FIG. 2 represents one embodiment for performing SSO and SSI events, that other register arrangements could be developed to perform the SSO and SSI functions.

Although the present invention and its advantages have been described in detail, it should be understood that various changes, substitutions and alterations can be made herein without departing from the spirit and scope of the invention as defined by the appended claims.

What is claimed is:

1. A circuit that operates in conjunction with at least one similar circuit to create a simultaneously switching outputs (SSO) event, the circuit comprising:

a toggle register that generates a toggling signal that changes state in response to a clock signal;

a signal line, connected to a signal pin, which carries a signal;

a logic circuit that is operable to select the toggling signal as an output for the SSO event in response to said signal;

an output driver that is operable to provide said output for said SSO event; and a gate logic being coupled to said signal line, and wherein said gate logic is operable to control said output driver in response to said signal.

2. The circuit of claim 1, further comprising:

a reset logic being coupled to a reset signal line, wherein said reset logic is operable to initialize a toggling phase of the toggle register in response to a reset signal on said reset signal line.

3. The circuit of claim 2, wherein:

the toggle register of the circuit is in toggling phase with a toggling register of the similar circuit.

4. The circuit of claim 2, wherein:

the toggle register of the circuit is out of toggling phase with a toggling register of the similar circuit.

5. The circuit of claim 1, wherein:

the toggle register operates with an inverted output line of the toggle register connected to an input line of the toggle register in a feedback arrangement.

6. The circuit of claim 1, wherein:

the signal pin is connected to a signal line of the similar circuit.

7. The circuit of claim 1, wherein:

the circuit is one of a plurality of circuits commonly located on a chip device and each circuit of the plurality of circuits has a respective signal line; and the signal pin is connected to a portion of the signal lines of the plurality of circuits.

8. The circuit of claim 7, wherein:

each circuit of the portion of the plurality of circuits simultaneously outputs their respective toggling signals to form the SSO event.

9. The circuit of claim 7, wherein:

the signal pin is connected to a control logic that is connected to each signal line of the plurality of circuits; and the control logic selects the portion of signal lines to connect with the signal pin.

10. The circuit of claim 7, wherein:

the chip device is mounted to an interconnect layer;

the interconnect layer is mounted to a main board; and the SSO event is used to test noise characteristics among the chip device, the interconnect layer, and the main board.

11. A method that uses a circuit in conjunction with at least one similar circuit to create a simultaneously switching outputs (SSO) event, the method comprising the steps of:

generating a toggling signal from a toggle register that changes state in response to a clock signal;

connecting a signal line to a signal pin; and selecting the toggling signal as output from the circuit for the SSO event with a signal carried on the signal line.

12. The method of claim 11, further comprising the step of:

initializing a toggling phase of the toggle register.

13. The method of claim 12, further comprising the step of:

toggling the toggle register of the circuit in phase with a toggling register of the similar circuit.

14. The method of claim 12, further comprising the step of:

toggling the toggle register of the circuit out of phase with a toggling register of the similar circuit.

15. The method of claim 11, further comprising the step of:

connecting the signal pin to a signal line of the similar circuit.

16. The method of claim 11, wherein the circuit further comprising an output driver, and the method further comprising the step of:

operating gate logic for controlling the output driver with the signal line.

17. The method of claim 11, wherein the circuit is one of a plurality of circuits commonly located on a chip device, and the method further comprising the step of:

connecting the signal pin to a portion of the signal lines of the plurality of circuits.

18. The method of claim 17, further comprising the step of:

outputting, simultaneously from each circuit of the portion of the plurality of circuits, their respective toggling signals to form the SSO event.

19. The method of claim 17, further comprising the steps of:

mounting the chip device to an interconnect layer;

mounting the interconnect layer to a main board; and using the SSO event to test characteristics among the chip device, the interconnect layer, and the main board.

20. The method of claim 19, further comprising the steps of:

developing a production chip device from the test characteristics;

mounting the production chip device to the interconnect layer; and mounting the interconnect layer to a main board.

* * * * *